(12) United States Patent
Murata et al.

(10) Patent No.: US 6,368,704 B1
(45) Date of Patent: Apr. 9, 2002

(54) CONDUCTIVE PASTE OF HIGH THERMAL CONDUCTIVITY AND ELECTRONIC PART USING THE SAME

(75) Inventors: Satoshi Murata; Miki Kashiwabara, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/193,047

(22) Filed: Nov. 16, 1998

(30) Foreign Application Priority Data

Nov. 17, 1997 (JP) ............................................. 9-330823

(51) Int. Cl.$^7$ ................................ B32B 5/16; H01B 1/20
(52) U.S. Cl. ...................... 428/323; 252/500; 252/514; 252/518.1; 252/519.33; 252/520.3; 361/600; 428/328; 428/689; 438/106
(58) Field of Search ............................. 252/500, 518.1, 252/514, 519.33, 520.3; 361/600; 438/106; 428/323, 411.1, 688, 689, 328; 523/440, 442

(56) References Cited

U.S. PATENT DOCUMENTS

| | | | |
|---|---|---|---|
| 3,923,697 A | * 12/1975 | Ellis ............................. 252/506 |
| 4,113,981 A | * 9/1978 | Fujita et al. ................ 174/88 R |
| 4,696,764 A | * 9/1987 | Yamazaki .................... 252/503 |
| 4,859,364 A | * 8/1989 | Yamamoto et al. .......... 252/512 |
| 5,180,523 A | * 1/1993 | Durand et al. ............... 252/512 |
| 5,326,636 A | * 7/1994 | Durand et al. ............... 428/323 |
| 5,433,893 A | * 7/1995 | Jost et al. .................... 252/514 |
| 5,463,190 A | * 10/1995 | Carson et al. ............... 174/259 |
| 5,616,173 A | * 4/1997 | Okamoto et al. ............ 106/117 |
| 5,652,042 A | * 7/1997 | Kawakita et al. ............ 428/209 |
| 5,736,261 A | * 4/1998 | Kano ........................... 428/552 |
| 6,139,777 A | * 10/2000 | Omoya et al. ............... 252/500 |

OTHER PUBLICATIONS

Japanese Office Action dated Feb. 9, 2000 with important Japanese language material enclosed within a black line box and English translation thereof.
Japanese Office Action dated Nov. 16, 1999 with Unexamined patent Application Publication (Kokai) No. 07–201896 dated Apr. 8, 1995 and 08–165410, together with black lined material and English translation thereof.

* cited by examiner

Primary Examiner—Hoa T. Le
(74) Attorney, Agent, or Firm—Michael Best & Friedrich LLC; J. Warren Whitesel (57) ABSTRACT

To provide a conductive paste that exhibits a high thermal conductivity (a low thermal resistance) after adhesion and hardening and that enables an adhesive layer to be formed thin and to provide an electronic part that has an excellent radiating capability and that enables the thickness of films to be reduced.

A conductive paste containing conductive particles, a hardenable resin, and a solvent has mixed therein fine spherical conductive particles such as Ag particles, the particle size is on the order of 0.05 to 1 $\mu$m, smaller than the first conductive particles. This conductive paste is used to mount an electronic part such as a semiconductor chip in producing a semiconductor package.

15 Claims, 6 Drawing Sheets

CONDUCTIVE PASTE OF HIGH THERMAL CONDUCTIVITY AND ELECTRONIC PART USING THE SAME

BACKGROUND OF THE INVENTION

1. Field of the Invention

The present invention relates to a conductive paste used to adhere a heating element such as a chip constituting an electronic part to a radiator such as a lead frame, and to an electronic part such as a semiconductor device to which a chip is adhered using this conductive paste.

2. Description of the Prior Art

Conventionally a hard solder is mainly used to adhere to and mount on a metal plate such as a lead frame, a chip constituting an electronic part such as a semiconductor device. A hard solder used as a mounting material (a die bonding material) generally comprises a eutectic alloy such as Au-Su (gold-tin) or Au-Sb (gold-antimony). Such a hard solder can efficiently transmit to the metal plate, heat generated in the chip, thereby enabling electronic parts with an excellent radiating capability to be produced.

Due to its high melting point, this hard solder must be heated to a high temperature in adhering the chip. Thus, if the chip comprises a semiconductor such as GaAs having a low heat resistance, it may have its properties degraded or may even be destroyed. In addition, due to the difference in thermal expansion coefficient between the hard solder and the chip, a stress may occur after mounting, resulting in warps or cracks. Besides, this hard solder is likely to cause voids to remain between the chip and the metal plate during adhesion. Moreover, to achieve appropriate mounting, a hard solder containing gold must be used but such a solder is very expensive. Besides, to achieve mounting without residual voids, skills are required to place and press the chip appropriately, so it is difficult to automate mounting with a hard solder.

Thus, the hard solder has many problems, but it is still used for electronic parts likely to become very hot, due to its high thermal conductivity.

Attempts are being made to use as a mounting material a silver paste consisting of silver (Ag) powder, a thermosetting resin, and a solvent, instead of the hard solder. This silver paste can transmit heat appropriately after adhesion and hardening due to the high thermal conductivity of silver, but is unlikely to thermally degrade the chip during mounting due to the relatively low hardening temperature of the mixed resin. In addition, the mixture of the resin serves to restrain stress, and costs are relatively low due to the prices of the mixed silver and resin lower than that of gold. Moreover, the amount of viscosity control agent (solvent) added can be adjusted to control the viscosity or thixotropy and handling the silver paste is easy, so a predetermined amount of paste can be selectively added to an adhesion surface by means of printing coating, injection, or dripping in order to allow the chip to be mounted appropriately, thereby enabling automation to be realized relatively easily.

Silver powder contained in such a silver paste has scale-shaped particles. Silver powder of scale-shaped particles contributes to improving the spreadability of the paste, thereby enabling it to be applied to the adhesion surface more easily. Since the silver powder serves to reduce the settling velocity of silver within the paste, the number of times that the paste is stirred during preparation or prior to use, thereby improving the operability during preparation or mounting and providing homogeneous paste to enable appropriate mounting. Furthermore, it serves to improve the shear strength after mounting to prevent the paste from being peeled off against a horizontal external force.

Such a silver paste, however, has a lower thermal conductivity (higher heat resistance) than the hard solder after adhesion and hardening, so electronic parts obtained using it have a low radiating capability. This is due to the small number of contacts among silver particles resulting in a small contact area or the orientation of scale-shaped silver particles leading to the variation of quality.

In general, to increase the thermal conductivity (reduce the heat resistance) of a silver paste after adhesion and hardening, the amount of silver powder in the paste may be increased. Too much silver powder, however, reduces the relative mixing amount in the paste of resin having an adhesive property to degrade the adhesive property of the silver paste. In addition, an increase in the amount of silver powder mixed increases the viscosity of the silver paste, resulting in the need to mix a large amount of solvent. As a result, after adhesion and hardening, the solvent may remain in a silver paste layer (an adhesive layer) or voids may occur therein, thereby degrading the properties such as thermal and electric conductivities and the reliability of the electronic part.

Japanese Patent Publications disclose the following two techniques as silver paste improvement techniques.

Japanese Patent Application Laid-Open No. 62-79635 discloses a silver paste containing metal balls larger than silver particles. Specifically, Cu balls of 50 to 200 $\mu$m particle size are mixed in the silver paste containing silver particles of 1 to 3 $\mu$m particle size. This application states that 10 to 50 vol. % of metal balls (Cu balls) can be effectively mixed in a silver paste containing 80 to 90 wt. % of silver particles after a solvent has been volatilized (cured). It indicates that the mixture of metal balls eliminates the variation of thermal conductivity while reducing the heat resistance from 90 to 85° C./W.

This silver paste, however, contains 10 to 50 vol. % of metal balls (Cu balls) of large particle size 50 to 200 $\mu$m, so when this paste is used for adhesion, the silver paste layer (the adhesive layer) becomes thick after adhesion and hardening. It is clear that with this size of metal balls, the thickness of the adhesive layer will be several hundred $\mu$m or more. Since the thickness of lead frames or chips is being continuously reduced down to about 200 $\mu$m, such an increase in the thickness of the adhesive layer is against the recent demand for the reduced size of packages and the reduced thickness of films. In addition, this application states that the metal balls prevent the thermal conductivity from varying and improve it, but does not describe the electric conductivity. The electric conductivity can be assumed to decrease because an increase in particle size generally reduces the number of contacts among the particles and thus the contact area.

Japanese Patent Application Laid-Open No. 7-201896 discloses a silver paste characterized in that it is composed of silver powder, a thermosetting resin, and a viscosity control agent and in that the silver powder consists of scale-shaped silver powder to which spherical silver powder of average particle size 5 to 10 $\mu$m is added. This application states that the average particle size of the scale-shaped silver powder is desirably between 4 and 10 $\mu$m and that the amount of spherical silver powder added is 5 to 50 wt. % of the total amount of silver powder.

The problems that this application for the silver paste attempts to solve are shown below. Due to a large amount of scale-like Ag powder contained, the die bonding material currently used (silver paste) has a reduced adhesive strength, is likely to be destroyed at the adhesion interface, and cannot be uniformly manufactured. Moisture attached to voids present in a die bonding layer or a control agent (a solvent) remaining in the layer may cause cohesive failure during molding process or package mounting, leading to package cracks. Japanese Patent Application Laid-Open No b. 7-201896 attempts to solve these problems.

The affects of this silver paste are described as follows. This invention (the above silver paste) replaces some of the scale-shaped Ag powder by larger spherical Ag powder as a method for solving the above problems. That is, the die bonding material currently used contains as large an amount of scale-shaped Ag powder as possible to improve its radiating capability, and due to its large area per unit weight, the scale-shaped Ag powder noticeably contributes to increasing the viscosity. In addition, an increased amount of viscosity control agent (a solvent) is added to regulate the viscosity. In addition, due to the reduced junction area of the thermosetting resin at the adhesion interface, the adhesive strength decreases. Thus, when some of the scale-shaped Ag powder is replaced by larger spherical Ag powder, the viscosity is precluded from increasing and the junction area of the thermosetting resin at the adhesion interface is increased to improve the adhesive strength.

This silver paste, however, is intended to improve the viscosity and adhesion strength as described above, and this application does not describe or suggest the improvement of thermal conductivity. In addition, since an increase in particle size generally reduces the number of contacts among the particles and thus the contact area, the above silver paste containing the larger spherical Ag particles is not expected to improve the thermal conductivity after adhesion and hardening or the radiating capability of electronic parts produced using this paste. In addition, this application neither describes the electric conductivity of the silver paste, and since an increase in particle size generally reduces the number of contacts among the particles and thus the contact area, the above silver paste containing the larger spherical Ag powder is not expected to improve the electric conductivity, as in the thermal conductivity. Furthermore, due to the use of the larger spherical Ag powder in the silver paste, the reduction of the thickness of films is limited.

OBJECT OF THE INVENTION

It is thus an object of this invention to provide a conductive paste that provides practically sufficient junction strength and paste viscosity, that provides high thermal and electric conductivities after adhesion and hardening, and that enables an adhesive layer to be formed thinner. It is another object of this invention to provide an electronic part produced using this conductive paste and having a high radiating capability and excellent electric characteristics.

SUMMARY OF THE INVENTION

By making various efforts to achieve these objects, the inventors have completed the present invention.

The present invention relates to a conductive paste of a high thermal conductivity characterized in that a conductive paste containing at least conductive particles, a hardenable resin, and a viscosity control agent has been mixed with fine spherical conductive particles smaller than the first conductive particles.

The present invention also relates to an electronic part composed of a heating element and a radiator adhered and fixed together via an adhesive layer characterized in that the adhesive layer consists of at least a mixture of conductive particles and a resin and in that the conductive particles are mixed in such a way that conductive particles of a smaller particle size are filled between conductive particles of a larger particle size.

BRIEF DESCRIPTION OF THE DRAWINGS

FIG. 7(a) shows thermal resistance and FIG. 7(b) shows the relative variation of a drain current.

DETAILED DESCRIPTION OF THE PREFERRED EMBODIMENTS

Embodiments of the present invention are described below in detail.

The material of conductive particles P used for a conductive paste according to this invention is not limited as long as it is electrically and thermally conductive. The material includes, for example, gold (Au), silver (Ag), copper (Cu), or an alloy containing one or more of these metals. Among them, conductive particles consisting of silver are preferable.

The Ag particles in an Ag paste that is a typical conductive paste have an average particle size between about 4 and 10 $\mu$m and are shaped like scales. In another Ag paste containing spherical Ag particles, the particle size of the spherical Ag particles is between 1 and 3 $\mu$m at minimum.

The conductive paste according to this invention is characterized in that it consists of a mixture of conductive particles of the above particle size and smaller fine spherical conductive particles Ps. The average particle size of the fine spherical particles is preferably between 0.05 and 1 $\mu$m and more preferably between 0.1 and 0.5 $\mu$m. Moreover, the particle size is preferably between 0.05 and 1 $\mu$m and particularly preferably between 0.08 and 0.6 $\mu$m. The ratio of fine spherical particles to larger conductive particles is preferably between 1/200 and ½, more preferably between 1/100 and ½, and much more preferably between 1/50 and ¼. The term "size", as used herein, refers to a particle size for spherical particles or the length of the particle plane in the longitudinal direction for scale-shaped particles. When this paste is applied to the production of an electronic part according to this invention, for example, a semiconductor device and if the size of the fine spherical conductive particles is beyond the above range, this may reduce the effects of this invention such as the improvement of the thermal and electric conductivities of a conductive paste layer after adhesion and hardening. Under the above range, however, the viscosity of the paste may be too high and the manufacturing costs of the fine spherical conductive particles may increase leading to the higher costs of final products.

The amount of the fine spherical conductive particles mixed into the conductive paste according to this invention is preferably between 20 and 90 wt. % of the total amount of conductive particles. It is more preferably between 25 and 80 wt. %. When this paste is applied to the production of an electronic part, for example, a semiconductor device and if the mixing amount is beyond the above range, this may excessively increase the viscosity of the paste, vary the thermal conductivity after adhesion and solidification or reduce the adhesive strength after adhesion and solidification. Under the above range, however, the effects of this invention such as the improvement of the thermal and electric conductivities of a conductive paste layer after adhesion and hardening may decrease or vary.

The shape of the conductive particles larger than the fine spherical conductive particles in the conductive paste according to this invention is not particularly limited, but for example, scale-shaped or spherical particles or their mixture may be used. Among them, scale-shaped particles are preferable.

The amount of all conductive particles mixed into the conductive paste according to this invention is set as required so as not to affect the thermal or electric conductivity or adhesive property of the paste after adhesion and hardening. To improve the thermal and electric conductivities, the amount of conductive particles mixed may be increased, but this reduces the relative amount of resin having an adhesive property, which is described below, thereby reducing the adhesive strength. Thus, depending on the type and usage of the electronic part, the mixing amount is adjusted as required taking desired thermal and electric conductivities and adhesive property into consideration.

The hardenable resin contained in the conductive paste according to this invention is not particularly limited as long as it does not affect the thermal or electric conductivity of the paste after adhesion and hardening and as long as it adheres two members together when hardened. Normally, a thermosetting resin such as an epoxy resin is used. A stiffener or a hardening accelerator may be mixed into the resin. The content of the hardenable resin in the paste is not particularly limited unless it affects the thermal or electric conductivity of the paste after adhesion and hardening and unless it degrades the adhesive property. It is adjusted as appropriate in the same way as the content of all conductive particles described above.

The viscosity control agent contained in the conductive paste according to this invention is not particularly limited as long as it dissolves the above hardenable resin to reduce the viscosity of the paste. The amount of viscosity control agent mixed is adjusted as required depending on the viscosity of the paste that varies with the amount of conductive particles in the conductive paste, the particle size or shape of the particles. The mixing amount, however, is preferably minimized so as to prevent the occurrence of voids and the stay of the solvent in the paste layer after adhesion and hardening, as described above.

Next, an electronic part is described that is produced using the conductive paste according to this invention described above.

The electronic part according to this invention is required to have a radiating capability and comprises a heating element and a radiator adhered and fixed together via an adhesive layer. This electronic part is characterized in that the adhesive layer consists of a mixture of at least conductive particles and a resin and in that the conductive particles are mixed in such a way that conductive particles of a smaller particle size are embedded between conductive particles of a larger particle size. Due to a high thermal conductivity despite the presence of an electric conductivity, such an adhesive layer improves the radiating capability and thus electric characteristics and durability of the electronic part. This may be because the mixture of smaller particles between larger particles increases the number of contacts among the particles and thus the contact area, thereby increasing the number of heat- and electricity-conducting path s from top to bottom of the adhesive layer. In addition, since some of the conventional larger particles are replaced by the smaller particles, the thickness of the adhesive layer can be reduced, thereby reducing the thickness of films in the electronic part and thus the thermal and electric resistances.

In the adhesive layer in the electronic part according to this invention having these effects, the average particle size of the conductive particles of a smaller particle size is preferably between 0.05 and 1 $\mu$m. In addition, the mixing rate of the conductive particles of a smaller particle size relative to all conductive particles in the adhesive layer is preferably between 20 and 90 wt. % and more preferably between 20 and 80 wt. %. The conductive particles of a larger particle size in the adhesive layer may be shaped like scales or spheres or their mixture. Among them, scale-shaped particles are preferable.

To form such an adhesive layer, the conductive paste according to this invention is preferably used. If the conductive paste according to this invention is used, the sizes of the conductive particles of a larger and a smaller particle sizes in the adhesive layer in the electronic part according to this invention are almost equal to the sizes of the larger conductive particles and fine spherical conductive particles in the conductive paste according to this invention.

Due to its small particle size, the fine spherical conductive particles in the paste according to this invention may be sintered due to heat used to harden the resin in the paste, so the shapes and sizes of the conductive particles in the adhesive layer formed may be slightly different from those of the conductive particles in the paste.

The electronic part according to this invention required to have a radiating capability includes, for example, a semiconductor package comprising a semiconductor chip installed on a lead frame, a radiating plate, or a circuit board. The size of such a semiconductor package and the thickness of films in the package are being continuously reduced to achieve high-density mounting, and the conductive paste according to this invention is optimal for the production of not only conventional relatively large packages but also smaller packages comprising thinner films.

The other applications of the conductive paste according to this invention include connections with electrodes in chip capacitors or resistors, plasma display electrodes, or heating elements in thermal heads.

Figure 1A:
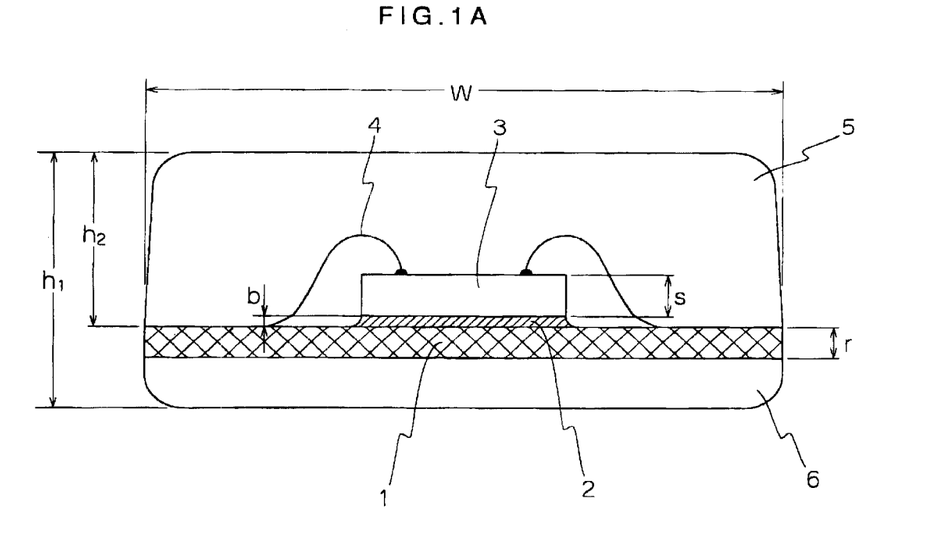
FIGS. 1A–1B is a schematic sectional view of a semiconductor package that is one embodiment of an electronic part according to this invention.
Figure 1B:
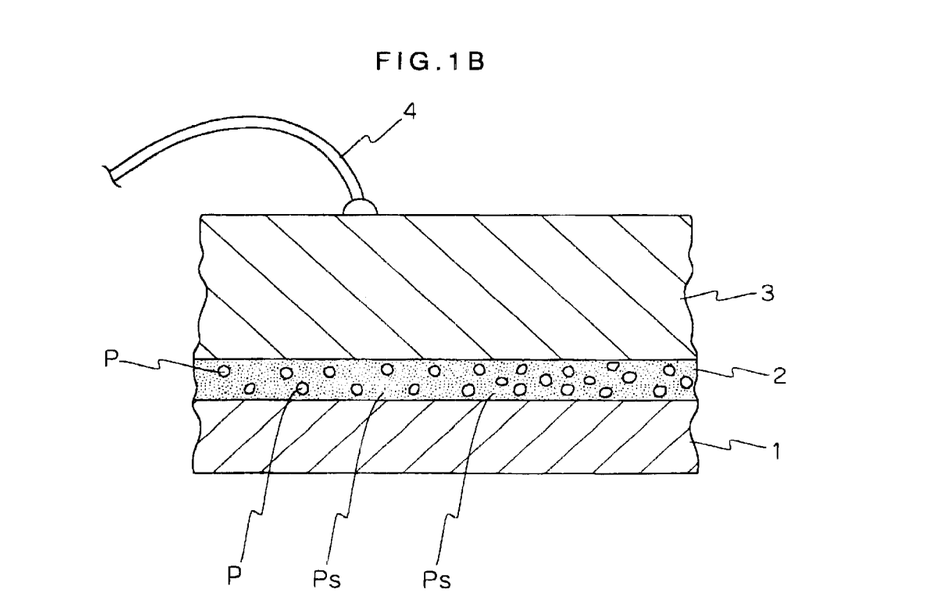

FIG. 1 is a schematic sectional view of a semiconductor package that is one embodiment of an electronic part according to this invention. A semiconductor chip 3 having an adhesive surface plated with Au is adhered and fixed to the upper surface of a lead frame 1 the surface of which is plated with Au, via an adhesive layer 2 according to this invention consisting of silver paste. Electrode sections on the semiconductor chip and predetermined leads from the lead frame 1 are connected together using bonding wires 4. The semiconductor chip and the bonding wires are sealed with mold resins 5 and 6 so as to be protected from external stress, moisture, or contamination. Although the shape of that part of the lead frame 1 which is located outside the resin is not shown, leads used to connect to a conductor pattern on a printed circuit board extend from the lead frame 1. Furthermore, to mount a semiconductor chip that can generate a larger amount of heat, the mold resin 6 may be omitted to obtain a semiconductor package having the lead frame 1 exposed as a radiating plate.

A step of mounting such a semiconductor package (adhering and fixing the semiconductor chip 3 to the upper surface of the lead frame 1) is carried out as follows.

Figure 2A:
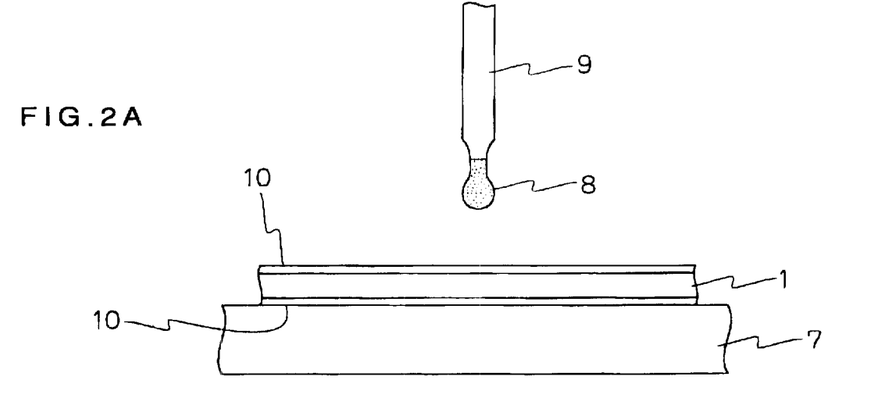
FIGS. 2A–2C is an explanatory drawing of a process for mounting the electronic part according to this invention.

First, as shown in FIG. 2(a), the lead frame 1 having a gold-plated layer 10 on its surface is placed on a heater 7 and pre-heated. A predetermined amount of conductive paste 8 is dripped onto the lead frame 1 through a nozzle 9.

Figure 2B:
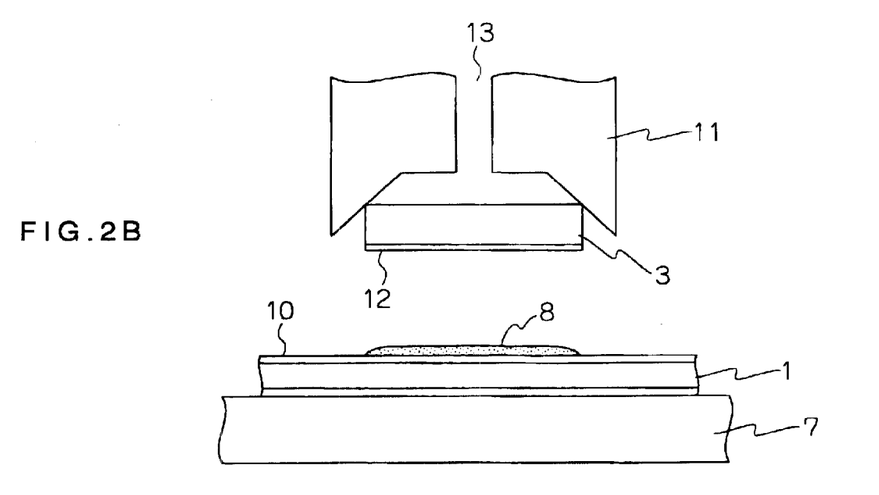

Next, as shown in FIG. 2(b), the semiconductor chip 3 having an Au-plated layer 12 is vacuum-sucked by a collet 11 through a suction hole 13 and positioned over the lead frame. The semiconductor chip 3 is then placed on the conductive paste 8 dripped onto the lead frame 1.

Figure 2C:
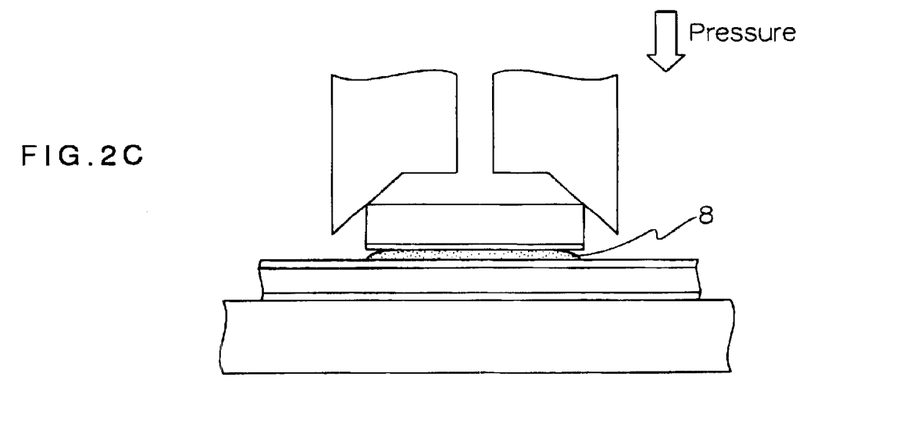

Subsequently, as shown in FIG. 3(c), the semiconductor chip placed on the conductive paste is gently pressed from above so as to be adhered to the paste appropriately, and the collet is then released. The conductive paste is then heated to volatilize the solvent while hardening the resin to finish mounting. The heating temperature must be sufficient to sufficiently volatilize the solvent while hardening the resin, but is not particularly limited unless it causes the semiconductor chip to be degraded. After hardening, the resin may be annealed at a predetermined temperature.

Due to their small particle size, the fine spherical conductive particles mixed into the conductive paste according to this invention have a low sintering temperature. Consequently, during the heating step, the conductive particles are sintered easily to enable heat or electron-conducting paths to be formed easily, thereby improving the thermal or electric conductivity compared to the conventional conductive pastes. Moreover, this invention eliminates the needs for annealing, which is required if the conventional conductive paste is used, thereby reducing the manufacturing time.

Figure 3:
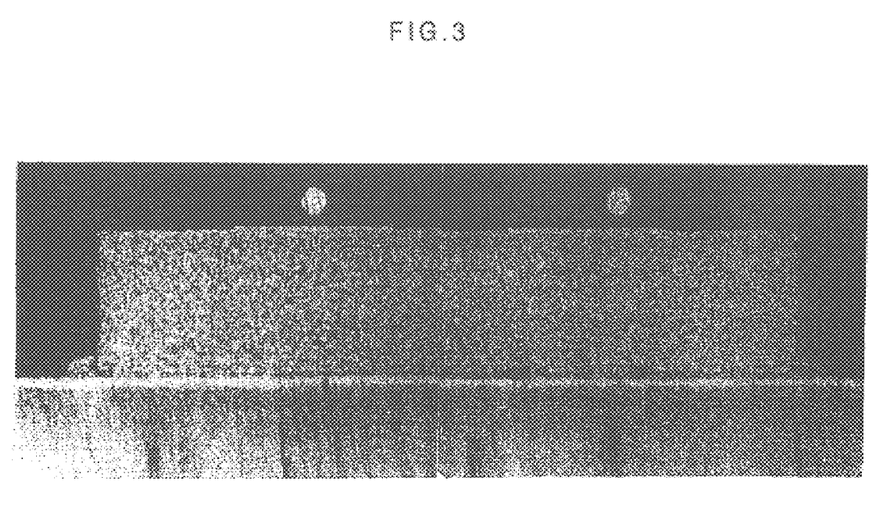
FIG. 3 is a photograph replacing the drawing, showing the state after the process for mounting the electronic part according to this invention.

FIG. 3 shows a semiconductor chip after mounting as seen from the side (a photograph replacing the drawing). The conductive paste comprises a mixture of scale-shaped Ag powder and fine spherical Ag powder according to this invention.

The radiator according to this invention is not limited to the radiating plate or lead frame as long as it allows a chip to be mounted thereon and as long as it can transmit heat.

This invention is described below in further detail with reference to an embodiment in which it was applied to the production of a semiconductor package, but it is not limited to this aspect.

As a conductive paste according to this invention, an Ag paste was produced that contained Ag powder comprising a mixture of scale-shaped Ag powder of 1×2 μm and 0.2 μm thick and fine spherical Ag powder of particle size between 0.1 and 0.5 μm; an epoxy resin; and a solvent. The amount of fine spherical Ag powder mixed was 25, 50, 75, or 90 wt. % of all Ag powder, and an Ag paste containing 0 wt. % of fine spherical Ag powder (containing only scale-shaped Ag powder) was also produced as a comparative example. In addition, the amount of all Ag powder mixed into the Ag paste was such that the content of Ag powder in the Ag paste would be 85 wt. % after hardening.

These Ag pastes were used to produce the semiconductor package shown in FIG. 1. A GaAs or Si chip that was plated with Au on its adhesive surface and that was 0.5×0.4 mm and 160 μm thick (s) and a lead frame comprising Cu or 42 alloy plated with Au and having a thickness (r) of 110 μm were used to produce a semiconductor package in which the adhesive layer 2 had a thickness (b) of 5 μm thick, in which the mold resin 5 had a thickness (h2) of 0.6 mm, in which the package had a thickness (h1) of 0.9 mm and a width (w) of 2 mm. The chip was mounted as shown in FIG. 2.

The adhesive layer in the package obtained was measured for thermal resistance and junction strength, and the package was evaluated for reliability. The adhesive layer was also observed using a SEM. With respect to the junction strength, a 2-mm² glass was adhered to a gold-plated lead frame using an Ag paste, an external force was applied to the glass in the direction parallel with the adhesive surface, and the junction strength referred to the external force being applied when the glass was peeled off.

The results shown in Table 1 indicate that the adhesive layer formed using the conductive paste according to this invention clearly had its thermal resistance reduced due to the mixture of fine spherical Ag powder. The thermal-resistance values in Table 1 are shown as ranges, and these values indicate the maximum and minimum values obtained by producing and evaluating multiple samples. The difference between the maximum and minimum values of thermal resistance, that is, the dispersion of heat resistance is clearly small. For comparison, the heat resistance of a hard solder (Au-Sn) was measured at 20.4 (° C./W). It is clear that the heat resistance value varies with the type of package.

Embodiment 4, in which the content of fine spherical Ag powder was 90%, had a large dispersion in thermal resistance and had a larger viscosity and a lower junction strength than Embodiment 1 (the content of fine spherical Ag powder: 75 wt. %) as shown in Table 2. Thus, in the process for manufacturing a semiconductor package using the dripping of a paste through a nozzle, the content of fine spherical Ag powder is preferably 90 wt. % or less and more preferably 80 wt. % or less. Even with 90 wt. % of fine spherical Ag powder, however, by changing the viscosity control agent or using the printing coating process, the disadvantages can be eliminated and the dispersion of thermal resistance can be reduced. In addition, due to the small dispersion obtained with 25 wt. % of fine spherical Ag powder, the lower limit of the content of these powders is preferably 20 wt. % or more and more preferably 25 wt. % or more.

TABLE 1

|  | Content of fine spherical Ag powder (%) | Content of scale-shaped Ag powder (%) | Thermal resistance (° C./W) | Dispersion of thermal resistance (° C./W) |
| --- | --- | --- | --- | --- |
| Embodiment 1 | 75 | 25 | 21.7–22.1 | 0.4 |
| Embodiment 2 | 50 | 50 | 26.3–26.7 | 0.4 |
| Embodiment 3 | 25 | 75 | 25.8–26.3 | 0.5 |
| Embodiment 4 | 90 | 10 | 22.5–24.6 | 2.1 |
| Comparative example | 0 | 100 | 29.2–31.7 | 2.5 |

TABLE 1-continued

| | Content of fine spherical Ag powder (%) | Content of scale-shaped Ag powder (%) | Thermal resistance (° C./W) | Dispersion of thermal resistance (° C./W) |
|---|---|---|---|---|

*Dispersion of heat resistance: differeence between the maximum and minimum values of heat resistance

TABLE 2

| | Junction strength at the room temperature (kg/2 mm$^2$) | Junction strength after heating (kg/2 mm$^2$) | Viscosity of the Paste (Ps) |
|---|---|---|---|
| Embodiment 1 | 0.74 | 0.61 | 50 |
| Embodiment 4 | 0.57 | 0.10 | 100 |

Figure 4:
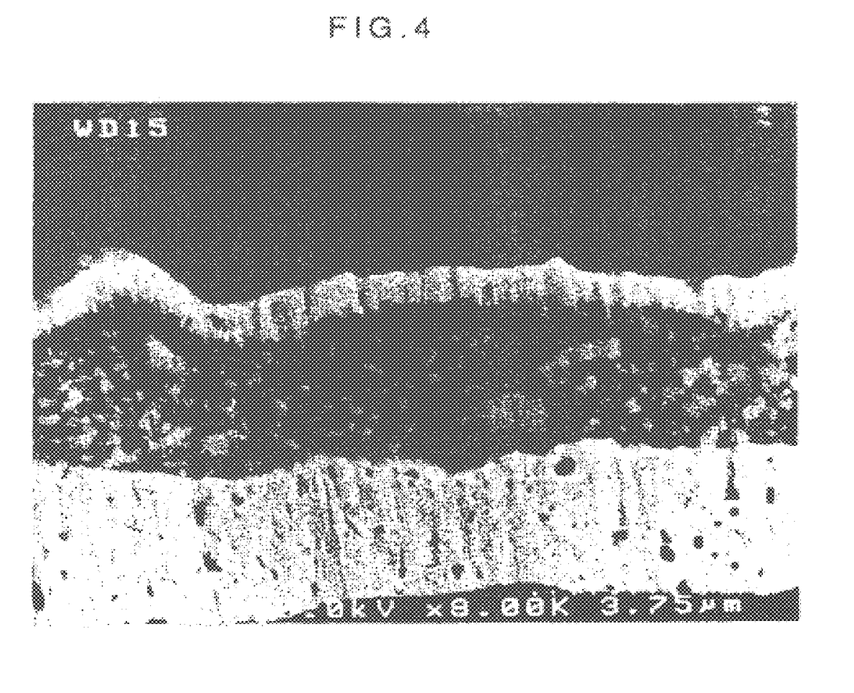
FIG. 4 is an SEM photograph (a photograph replacing the drawing) of an adhesive layer portion of the electronic part according to this invention.
Figure 5:
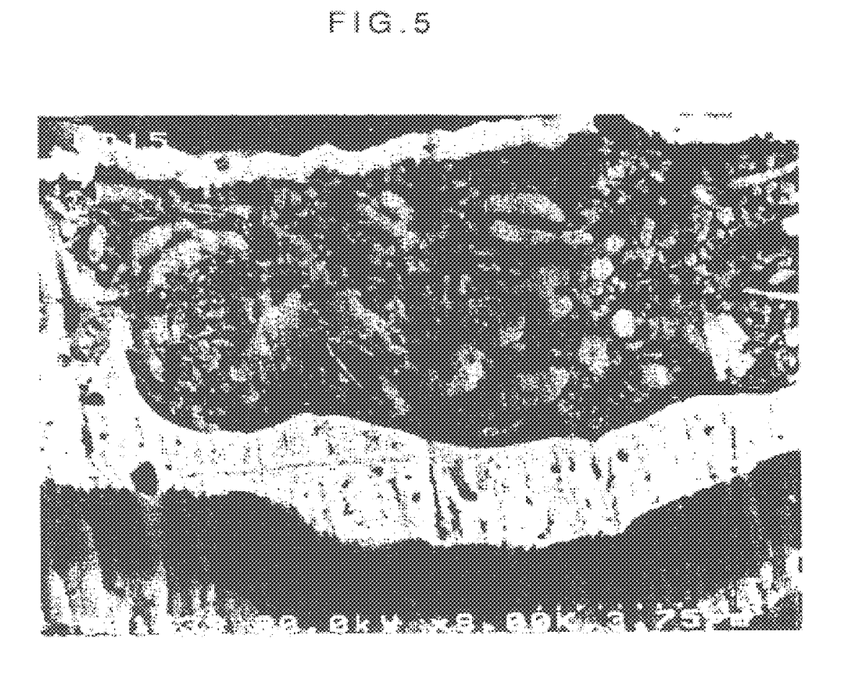
FIG. 5 is an SEM photograph (a photograph replacing the drawing) of an adhesive layer portion of the electronic part according to this invention.
Figure 6:
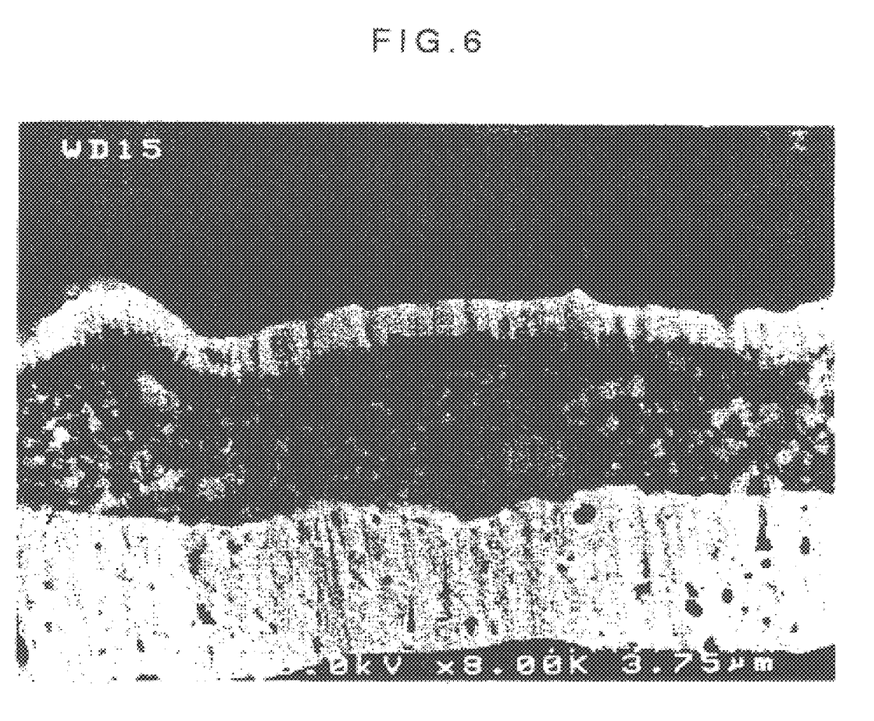
FIG. 6 is an SEM photograph (a photograph replacing the drawing) of an adhesive layer portion of a conventional electronic part.

FIGS. 4 and 5 show SEM photographs of the adhesive layers in the semiconductor packages obtained according to Embodiments 1 and 2. FIG. 6 shows a SEM photograph of the adhesive layer in the semiconductor package obtained according to Comparative Example. The white band-like portions in the top and bottom of the photographs show Au-plating layers. The region between the two Au-plating layers is an adhesive layer, in which the white portion shows Ag particles, while the black portion shows a resin. The fine Ag particles are slightly sintered.

As is apparent from FIGS. 4 and 5, in the adhesive layer in the semiconductor package according to this invention, the fine Ag particles are almost uniformly mixed between the larger scale-shaped Ag particles and the resin portion is small. On the other hand, as seen in FIG. 6, in the adhesive layer containing only scale-shaped Ag particles, the distribution and orientation of the particles are not uniform, and the resin portion is large. The conductive paste according to this invention reduces the dispersion of the thermal resistance of the adhesive layer because the fine conductive particles are mixed between the scale-shaped Ag powder to make the distribution and orientation of the scale-shaped particles uniform while increasing the contact probability among the particles.

Figure 7A:
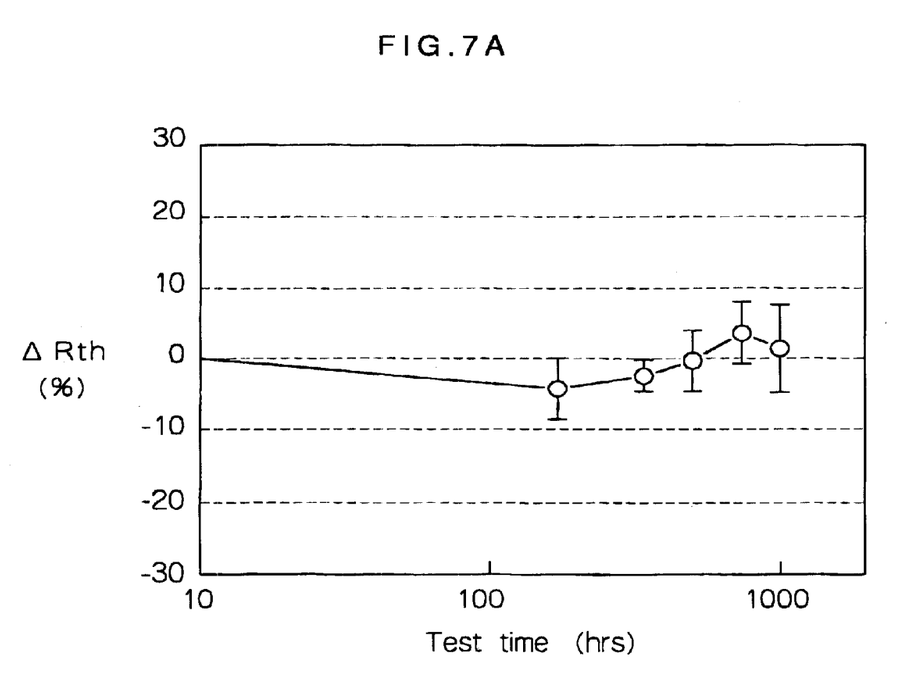
FIGS. 7A–7B shows the results of the tests of the reliability of a semiconductor package that is the electronic part according to this invention.
Figure 7B:
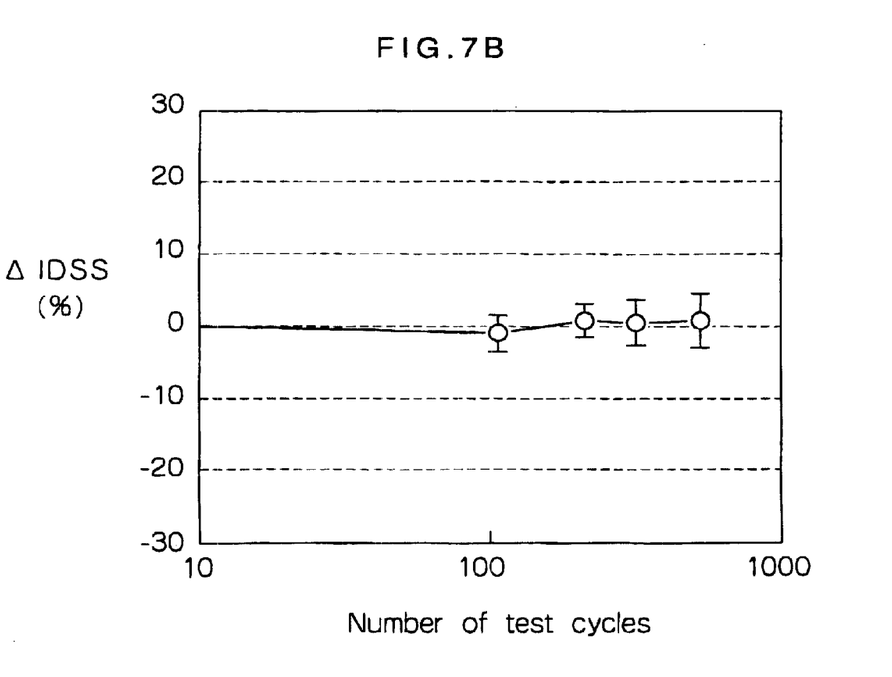

FIG. 7 shows the results of the reliability test of the semiconductor package produced using the Ag paste according to Embodiment 1. FIG. 7(a) shows the results of measurements of the thermal resistance (Rth) of 20 samples stored at a high temperature of 150° C. until 1,000 hours had passed since the start of the test (relative value; $\Delta$Rth). FIG. 7(b) shows the relative variation ($\Delta$IDSS) of a drain current observed when the 20 same samples were used to repeat a temperature cycle from −65° C. through 25° C. to 150° C. (1 cycle lasts about 70 minutes) 500 times. The drain current was measured when the gate and drain voltages of the FET chip were set at 0 V and 1.5 V, respectively. In either test, the variation of each value fell within ±10% of the initial value, indicating that the semiconductor package according to this invention has a stable radiating capability and electric characteristics and is thus practically sufficiently reliable.

As described above, this invention can provide a conductive paste that can provide a practically sufficient junction strength and paste viscosity, that exhibits a high thermal conductivity (a low thermal resistance) after adhesion and hardening, and that allows an adhesive layer to be formed thin. In addition, the conductive paste according to this invention prevents the thermal resistance (thermal conductivity) after adhesion and hardening from varying and has a sufficient electric conductivity.

Thus, the conductive paste according to this invention can be appropriately applied to the production of an electronic part that generates heat easily and that is susceptible to heat, particularly, an electronic part on which a semiconductor chip such as a power device is mounted.

In addition, the conductive paste according to this invention enables a thin adhesive layer to be formed, thereby allowing the thickness of films and the size of electronic parts to be reduced. The thermal conductivity after adhesion and hardening of the conductive paste according to this invention is still lower than that of hard solder but has been improved up to a value very close to it, and the conventional hard solder requires the adhesive layer to have a certain thickness (between 12 and 16 $\mu$m for Au-Sn) resulting in the limitation of the reduction of the thickness of films and the size of electronic parts. Thus, the conductive paste according to this invention is particularly effective on electronic parts for which the conventional hard solder must be used due to its easiness with which it generates heat and its susceptibleness to heat and that requires the thickness of films and their own sizes to be reduced.

An electronic part produced using the conductive paste according to this invention for adhesion and fixation has an excellent radiating capability due to the high thermal conductivity of its adhesive layer. In addition, due to its sufficient electric conductivity, the adhesive layer has excellent electric characteristics. Besides, due to the small thickness, the adhesive layer provides high thermal and electric conductivities to enable the thickness of the films and the size of the electronic part to be reduced. Moreover, due to its practically sufficient adhesive strength, the electronic part according to this invention is sufficiently reliable.

What is claimed is:

1. A highly thermal conductive silver paste containing at least first conductive silver particles having a particular geometric shape and size and a hardenable resin having fine spherical conductive silver particles which are smaller than the first conductive particles, wherein the particle size of said fine spherical conductive particles is between 0.05 and 1 $\mu$m, said first conductive particles and said fine spherical particles being in intimate contact and mixed in said resin.

2. A conductive paste according to claim 1 wherein said fine spherical conductive particles are between 20 and 90 wt. % of all conductive particles.

3. A conductive paste according to claim 1 wherein said first conductive particles consist of scale-shaped particles and spherical particles.

4. An electronic part comprising a heating element adhered and fixed to a heat radiating element via an adhesive layer comprising:

said adhesive layer including at least first conductive particles having a relatively large diameter and a resin including fine spherical conductive particles having diameters which are relatively smaller than said large diameter, said fine particles being mixed with said first conductive particles and said resin, wherein the particle size of said fine spherical conductive particles is between about 0.05 and 1 $\mu$m; said fine spherical conductive particles are between 20 and 90 wt. % of all conductive particles.

5. An electronic part according to claim 4 wherein said first conductive particles of a large particle size are scale-shaped.

6. An electronic part according to claim 4 wherein said conductive particles of a large particle size are spheres.

7. An electronic part according to claim 4 wherein said first conductive particles of a large particle size are a mixture of scale-shaped particles and spherical particles.

8. An electronic part according to claim 4 wherein said first conductive particles are made of silver.

9. An electronic part according to claim 4 wherein said heating element is a semiconductor device.

10. A highly thermal conductive Ag paste containing at least conductive particles in close and intimate contact, a hardenable resin and a viscosity control agent; wherein said conductive particles include a mixture of Ag scale-shaped particles and fine Ag spherical particles, said fine Ag particles being smaller than said Ag scale-shaped particles and having an average particle diameter in the order of 0.05 to 1 $\mu$m.

11. A highly thermal conductive Ag paste according to claim 10 wherein said fine Ag spherical particles are between about 20 and 90 wt. % of all conductive particles in said mixture.

12. An electronic part as described in either one of the claims 10 or 11 wherein said part comprises a heating element adhered and fixed to a heat radiating member via said Ag paste.

13. An electronic part comprising:

a heating element adhered and fixed to a heat radiating element via a conductive adhesive layer; said adhered layer including at least conductive Ag particles and a resin, and said conductive particles including a mixture of scale-shaped particles and fine spherical particles, said fine particles having an average diameter of 0.05 to 1 $\mu$m and being smaller than said scale-shaped particles; and said fine spherical particles being embedded between and in intimate contact with said scale particles.

14. An electronic part according to claim 13 wherein said fine Ag spherical particles are between 20 and 90 wt. % of all conductive particles in said adhesive layer.

15. An electronic part according to either one of the claims 13 or 14 wherein said electronic part includes a semiconductor device.

* * * * *